US012799627B2

(12) United States Patent
Wei et al.

(10) Patent No.: US 12,799,627 B2
(45) Date of Patent: Nov. 17, 2026

(54) CRYSTAL GROWTH METHOD USING ASYMMETRIC HORIZONTAL MAGNETIC FIELD

(71) Applicants: Zing Semiconductor Corporation, Shanghai (CN); Shanghai Institute of Microsystem and Information Technology, Chinese Academy of Sciences, Shanghai (CN)

(72) Inventors: Xing Wei, Shanghai (CN); Wenkai Liu, Shanghai (CN); Zhongying Xue, Shanghai (CN); Yun Liu, Shanghai (CN); Rongwang Dai, Shanghai (CN); Minghao Li, Shanghai (CN); Yuehui Yu, Shanghai (CN)

(73) Assignees: Zing Semiconductor Corporation, Shanghai (CN); Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 217 days.

(21) Appl. No.: 18/537,785

(22) Filed: Dec. 12, 2023

(65) Prior Publication Data

US 2024/0218564 A1 Jul. 4, 2024

(30) Foreign Application Priority Data

Dec. 31, 2022 (CN) ........................ 202211734788.X

(51) Int. Cl.
*C30B 30/04* (2006.01)
*C30B 15/20* (2006.01)
(Continued)

(52) U.S. Cl.
CPC .............. *C30B 30/04* (2013.01); *C30B 15/20* (2013.01); *C30B 29/06* (2013.01); *H01F 6/06* (2013.01); *H10D 86/201* (2025.01)

(58) Field of Classification Search
CPC ......... C30B 15/00; C30B 15/20; C30B 15/22; C30B 15/30; C30B 15/305; C30B 29/00;
(Continued)

(56) References Cited

U.S. PATENT DOCUMENTS

2006/0144321 A1* 7/2006 Lu .......................... C30B 15/22 117/30
2009/0183670 A1 7/2009 Cho et al.
(Continued)

FOREIGN PATENT DOCUMENTS

CN 101498032 A 8/2009
CN 108026660 A 5/2018
(Continued)

OTHER PUBLICATIONS

Taiwanese Office Action, dated Aug. 2, 2024, in a counterpart Taiwanese patent application, No. TW 112147895.
(Continued)

*Primary Examiner* — Kenneth A Bratland, Jr.
(74) *Attorney, Agent, or Firm* — Chen Yoshimura LLP

(57) ABSTRACT

The present invention provides a crystal growing method, an apparatus and a RF-SOI substrate for growing a crystal. The crystal growing method may comprise: controlling a first superconducting coil to generate a first current, and controlling a second superconducting coil to generate a second current, wherein a value of the first current is not equal to a value of the second current, the first superconducting coil and the second superconducting coil are superconducting coils positioned oppositely outside a crucible to generate a magnetic field in the crucible; and pulling upwards to grow
(Continued)

1:n a monocrystalline in an asymmetric magnetic field generated by the first current and the second current in the crucible.

5 Claims, 5 Drawing Sheets

(51) Int. Cl.
*C30B 29/06* (2006.01)
*H01F 6/06* (2006.01)
*H10D 86/00* (2025.01)

(58) Field of Classification Search
CPC ......... C30B 29/02; C30B 29/06; C30B 30/00; C30B 30/04; H01F 6/06; H10D 86/201
USPC ....... 117/11, 13, 30, 32, 200, 206, 208, 221, 117/917, 928, 931–932
See application file for complete search history.

(56) References Cited

U.S. PATENT DOCUMENTS

2018/0237940 A1* 8/2018 Takano ................... C30B 30/04
2020/0407875 A1* 12/2020 Matsushima ......... C30B 15/305
2021/0108337 A1 4/2021 Yokoyama et al.
2021/0123155 A1* 4/2021 Tang ....................... C30B 15/00

FOREIGN PATENT DOCUMENTS

JP 6601420 B2 11/2019
TW I687558 B 3/2020

OTHER PUBLICATIONS

Chinese Office Action, dated Jan. 22, 2026, and Search Report dated Jan. 20, 2026, in a counterpart Chinese patent application, No. CN 202211734788.X.

* cited by examiner

1:1 current ratio

1:n current ratio

CRYSTAL GROWTH METHOD USING ASYMMETRIC HORIZONTAL MAGNETIC FIELD

FIELD OF THE INVENTION

The present invention generally relates to a technical field of crystal growth, and specifically, relates to a crystal growing method, an apparatus and an RF-SOI substrate.

BACKGROUND OF THE INVENTION

RF-SOI substrates are an unique sandwiched (i.e. silicon/insulation layer/silicon three-layered structure) silicon-based semiconductor materials using buried insulating layer ($SiO_2$ usually) to implement insulation between devices and substrate. Therefore, RF-SOI substrates become a key material among all substrate materials for 5G radio frequency chip due to their low consumption, high linearity, high breakdown voltage, high thermal conductivity, high integration and relative low cost.

Currently, RF-SOI substrates need a layer of high-resistance single-crystal silicon substrate. However, because oxygen in the single-crystal silicon will generate thermal donors that cause decrease of resistance, another requirement is lower oxide content in the layer of high-resistance substrate.

To reduce the oxide content in the single-crystal silicon, a FZ method (float zone method) would be applied to grow traditional 8-inched high-resistance substrates, but not 12 inched ones with a great crucible, great mass of silicon melt because surface tension of silicon melt is not sufficient to support its weight. Only Czochralski method can be used to grow 12-inched high-resistance substrates.

Although current Czochralski method may be improved by applying a particular magnetic field, such as horizontal magnetic field, cusp magnetic field, etc., such modifications cannot inhibit the problems of flowing silicon melt and high oxygen content in the single-crystal silicon.

SUMMARY OF THE INVENTION

In light of one of the aforesaid problems, the present invention provides a crystal growing method, an apparatus and an RF-SOI substrate forming an asymmetric magnetic field based on a ratio of current for growing single-crystal silicon with Czochralski method.

One aspect of the present invention is to provide a crystal growing method, comprising: controlling a first superconducting coil to generate a first current, and controlling a second superconducting coil to generate a second current, wherein a value of the first current is not equal to a value of the second current, and the first superconducting coil and the second superconducting coil are superconducting coils which are distributed outside a crucible, opposite to each other, to generate a magnetic field in the crucible; and based on the first current and the second current, pulling up to grow a single crystal in the magnetic field in the crucible, which is asymmetric magnetic field.

Optionally, a ratio of the value of the first current to the value of the second current may be 1:n, and n is not be equal to 1.

Optionally, the first superconducting coil may have a round shape, an oval shape or a saddle shape, and/or the second superconducting coil may have a round shape, an oval shape or a saddle shape.

Optionally, the first superconducting coil may have a singular number or a plural number, and/or the second superconducting coil may have a singular number or a plural number.

Optionally, with a first controller, the first superconducting coil may be controlled to generate the first current, and with a second controller, the second superconducting coil may be controlled to generate the second current.

Another aspect of the present invention is to provide an apparatus for crystal growth, comprising a crucible; a first superconducting coil and a second superconducting coil, distributed outside the crucible, opposite to each other, to generate a magnetic field in the crucible; a controller, controlling the first superconducting coil generating the first current and controlling the second superconducting coil generating the second current, wherein a value of the first current is not equal to a value of the second current; and a pulling-up mechanism, pulling up to grow a single crystal in the magnetic field in the crucible, which is asymmetric magnetic field, based on the first current and the second current.

Optionally, the controller may comprise a first controlling unit and a second controlling unit, the first controlling unit may control the first superconducting coil to generate the first current, and the second controlling unit may control the second superconducting coil to generate the second current.

Optionally, the first superconducting coil may have a round shape, an oval shape or a saddle shape, and/or the second superconducting coil may have a round shape, an oval shape or a saddle shape.

Optionally, the first superconducting coil may have a singular number or a plural number, and/or the second superconducting coil may have a singular number or a plural number.

Yet, another aspect of the present invention is to provide a RF-SOI substrate, which is obtained by one of the crystal growing methods disclosed in the present invention or grown with one of the apparatuses disclosed in the present invention.

Compared with current technologies, at least one crystal growing method, apparatus and RF-SOI substrate disclosed in the present invention may be beneficial to: applying a flexible ratio of coil current of 1:n which replaces a rigid horizontal symmetric magnetic field of 1:1 to obtain the asymmetric horizontal magnetic field that inhibits flowing of melt. As such, an asymmetric convection enhancing volatilization of oxide at a free surface may be obtained due to non-uniform inhibition effects of the asymmetric horizontal magnetic field to the melt, so as to significantly reduce the oxygen content in the single-crystal silicon made by Czochralski method to satisfy the required low oxygen content of RF-SOI substrates.

BRIEF DESCRIPTION OF THE DRAWINGS

To clearly illustrate embodiments of the present invention, drawings used in the embodiments are introduced here. Apparently, these drawings only disclose some embodiments according to the present invention; however, those ordinarily skilled in the art may obtain some other drawings without creative efforts based on these drawings.

DESCRIPTION OF EMBODIMENTS OF THE INVENTION

Figure 1:
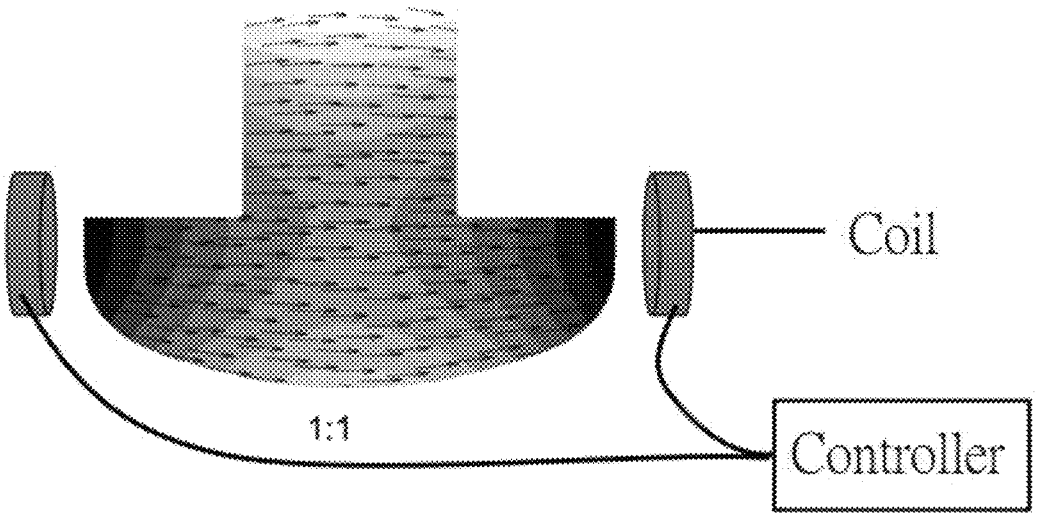
FIG. 1 shows a perspective view of a symmetric horizontal magnetic field formed with a ratio of current of 1:1.

Reference is now made to the following examples taken in conjunction with the accompanying drawings to illustrate implementation of the present invention.

Great details are provided here so that this disclosure will be thorough, and will fully understand the present application to person skilled in the art. Apparently, examples disclosed here are only some embodiments of the present invention, not every embodiment. In addition to the detailed description, the present invention also may be implemented in other ways, the details disclosed here may be modified or changed without departing from the merits of the invention. Please note that features and examples described here may be implemented in a combination without contradiction. Scope protected by the present invention covers all other embodiments obtained without creative efforts by a person with ordinary skill.

Various aspects of the embodiments covered by claimed scopes according to the present invention are illustrated in the following paragraphs. These aspects may be implemented in various forms and specific structure and/or functionality disclosed here are only for example. Based on the disclosure, those skilled in the art will understand that one or more aspects of the embodiments may be implemented solely or in a combination. For instance, the device and/or method may be implemented in any number or aspect. Further, one or more other structure and/or functionality disclosed in the aspects of the embodiments may be used to implement the device and/or method.

Please also note that the figures provided here are only exemplary ones illustrating basic idea of the present invention. Only elements relative to the invention are shown therein. Actual number, shape, sizes, type and proportion may be varied in an implementation. Layout or arrangement may be more complicated.

Further, these embodiments may be readily understood based on the details provided here. However, those skilled in the art will understand that some example embodiments may be implemented without these specific details.

Oxygen atoms in the single-crystal silicon mainly come from dissolution of a quartz crucible and move along with flows of a silicon melt. At a free surface, the oxygen atoms bind to silicon atoms to form volatized SiO. Currently, when applying a specific magnetic field during performing Czochralski method may improve growth of the single-crystal silicon to a certain extent.

For example, a patent document, JP6601420B2, which provided a method of manufacturing a single crystal and a pulling apparatus of a single crystal, proposed to change relative position between a horizontal magnetic field and the melt during various stages of growth of single-crystal silicon when using Czochralski method, so as to decrease oxygen content in the crystal. However, such technology can only make a single-crystal silicon having an oxygen content of $2.2\times10^{17}$ atoms/cm$^3$, an order of magnitude which is about 1E18, at best, and such single-crystal silicon cannot be used to make RF-SOI substrates.

Another patent document, JP6601420B2, which provided a method of manufacturing a single crystal and a pulling apparatus of a single crystal, proposed to control a shape of a solid-liquid interface between a melt and a grown silicon crystal with a changeable magnetic field, such as a cusp magnetic field. Through a changeable power supply and a controller, three types of cusp magnetic configurations, including a roughly symmetric one, a mainly horizonal one, and a mainly vertical one, are formed. The shape of the solid-liquid interface may be controlled by controlling to configure a required magnetic field during various stages of growth of the crystal. However, when sizes of a crucible and a melt are increased along with a size of the crystal, a turbulence intensity in the melt is increased accordingly. Given that a magnetic intensity in the center of the cusp magnetic field is weaker, it will be more difficult to inhibit flow of the melt there. Therefore, to grow a 12-inched single-crystal silicon, currently, the horizonal magnetic field configuration dominants In view of aforesaid problems, when researching and trying to improve current Czochralski method with an applied magnetic field, we found: as shown in FIG. 1, most of the horizonal magnetic field applied to current Czochralski method is generated by two superconducting coils positioned at both sides, and the superconducting coils controlled by a controller generate equal currents, so that magnetic intensities in the crucible are almost symmetric, i.e. a symmetric horizontal magnetic field is formed in the crucible; as shown in FIG. 2, two superconducting coils positioned at both sides are controlled to generate different currents , i.e. unequal currents making a current ratio of 1:n, no longer making one of 1:1, and meanwhile, an asymmetric horizontal magnetic field is formed in the crucible, in which deeper color indicates greater magnetic intensities and arrows indicate directions of lines of magnetic flux.

Figure 2:
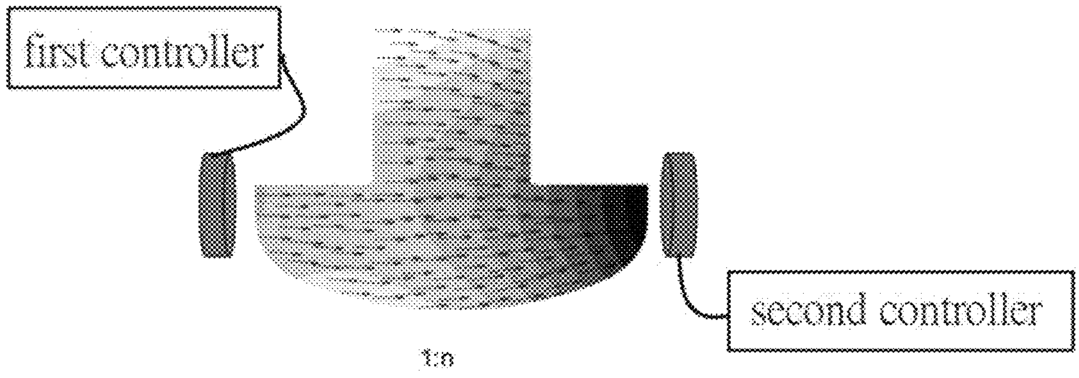
FIG. 2 shows a perspective view of an asymmetric horizontal magnetic field formed with a ratio of current of 1:n.

The distribution of the magnetic flux shown in FIG. 1 shows a horizontal magnetic field having symmetric magnetic flux intensities. The distribution of the magnetic flux shown in FIG. 2 shows a horizontal magnetic field having asymmetric magnetic flux intensities generated by adjusting the current ratio to another ratio, such as 1:n, in which n may be a number which is not equal to 1, the number may be an integer, a floating number, etc.

Figure 3:
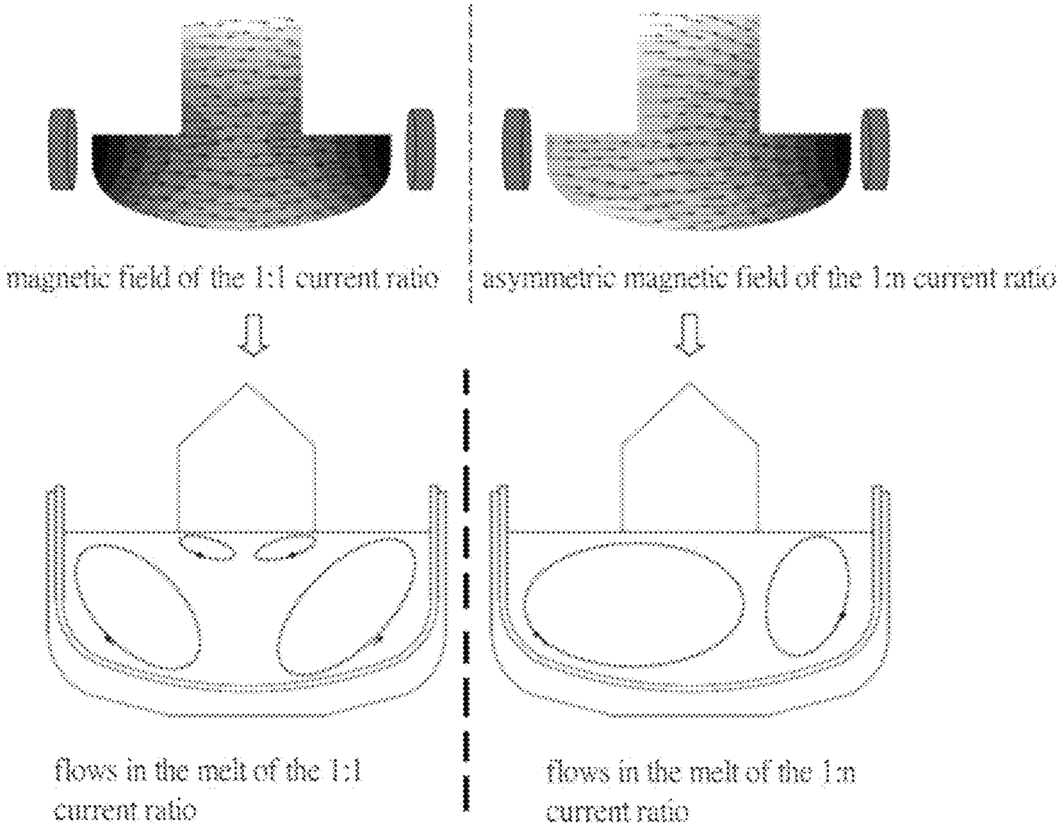
FIG. 3 shows a structure of the melt flowing under different ratios of current.

When researching and studying what will happen after changing the current ratio, we also found: as shown in FIG. 3, under a symmetric magnetic field, the same inhibition toward a melt at both sides of a crucible is caused by symmetric magnetic flux intensities, and at this time, flows of the melt are also symmetric (as shown in a left half of FIG. 3), and this makes stronger turbulence intensity in the melt; however, different inhibitions toward the melt at the both sides of the crucible are caused by asymmetric magnetic flux intensities: inhibition is weaker at the side with a weaker current (as shown in a right half of FIG. 3), and natural convection occupies more space there because natural convection caused by thermal buoyancy is relatively stronger. As such, after vaporizing the melt with abundant oxygen rising along with a sidewall of the crucible at a free surface sufficiently, the oxygen content is decreased significantly. Afterwards, the melt having low oxygen content goes to a crystalizing interface. Therefore, the oxygen content in the crystal is decreased significantly.

Figure 4:
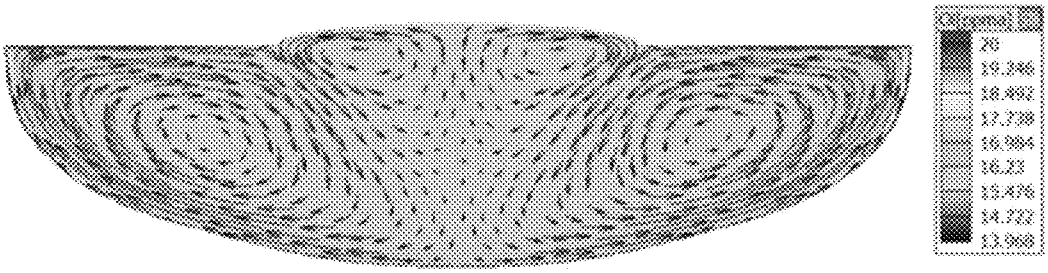
FIG. 4 shows an oxygen content cloud atlas when a ratio of current is 1:1.
Figure 5:
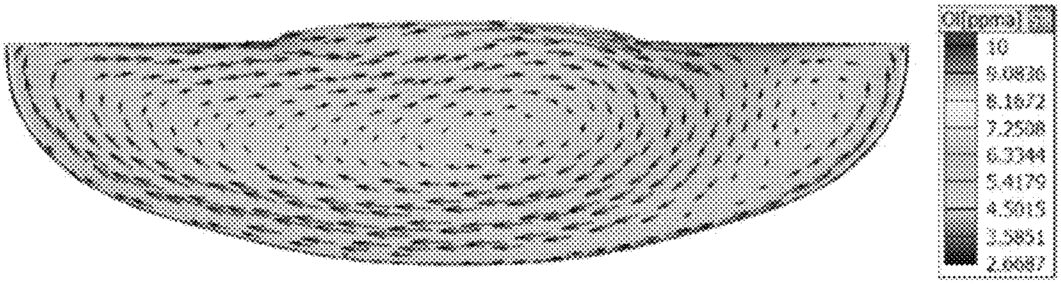
FIG. 5 shows an oxygen content cloud atlas when a ratio of current is 1:n.

After carefully analyzing two oxygen content cloud atlas corresponding to some specific current ratio, it is found that:

when the current ratio is 1:1, as shown in FIG. 4, the oxygen content at the crystalizing interface is about 15 ppma, and the current ratio is 1:n, as shown in FIG. 5, the oxygen content at the crystalizing interface is about 4 ppma.

Therefore, through adjusting the current ratio of the superconducting coils outside the crucible, the asymmetric horizontal magnetic field may be provided to the crucible. With the asymmetric horizontal magnetic field, asymmetric flows beneficial to reduce not only the turbulence intensity in the melt but also the oxygen content in the crystal significantly may be formed during performing Czochralski method. As such, the grown crystal may be used for making RF-SOI substrates.

Figure 6:
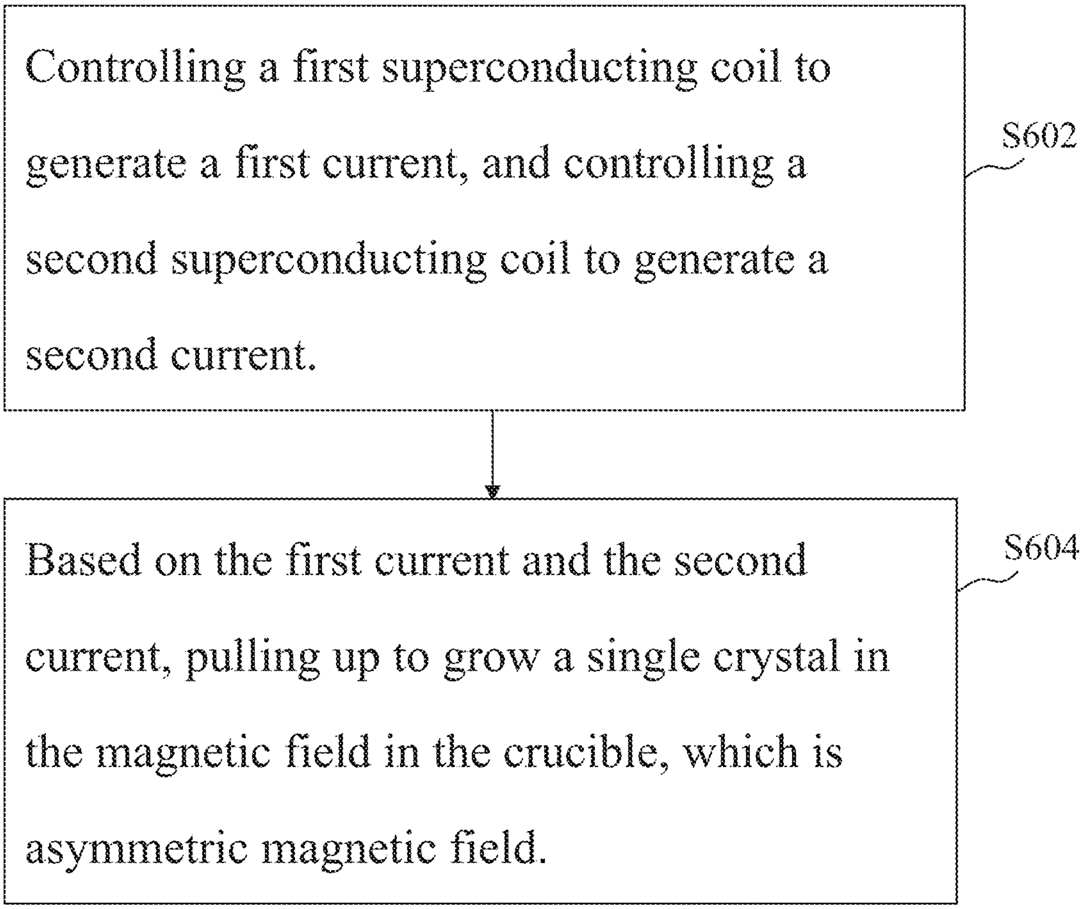
FIG. 6 shows a flow chart of a crystal growing method.

Here, some examples are provided. As shown in FIG. 6, a crystal growing method is provided. The method may comprise a step of S602 which is controlling a first superconducting coil to generate a first current, and controlling a second superconducting coil to generate a second current. A value of the first current may be not equal to a value of the second current, and the first superconducting coil and the second superconducting coil may be superconducting coils which are distributed outside the crucible, opposite to each other, to generate a magnetic field in the crucible.

As illustrated in the previous paragraphs, when the current ratio is no longer 1:1, the asymmetric magnetic field may be formed in the crucible by the superconducting coils. The asymmetric magnetic field may provide an asymmetric horizontal magnetic flux distribution altering crystal growth during Czochralski method and inhibiting to different extents for the melt at the both sides of crucible. The melt at one of the two sides which corresponds to the weaker current may be inhibited less, but affected by a relatively stronger natural convection which occupies more space due to thermal buoyancy. Given that the main resource of the oxygen in the single-crystal silicon is the dissolved crucible, dissolved oxygen moves along with the flows of the melt, and oxygen binds to a silicon atom and volatilizes in the form of SiO at the free surface, after applying the asymmetric magnetic field to the crucible and fully evaporating the melt with abundant oxygen, rising along with the sidewall of the crucible, the melt with a low oxygen content reaches the crystalizing interface and the oxygen content in the single crystal is significantly reduced.

The method may comprise a step of S604 which is based on the first current and the second current, pulling up to grow the single crystal in the magnetic field in the crucible, which is asymmetric magnetic field.

Through adjusting the current ratio, the asymmetric horizontal magnetic field applied during Czochralski method is formed in the crucible. Because the inhibition of the asymmetric magnetic field is ununiform, an asymmetric structure of flow is formed in the melt, so as to significantly reduce the oxygen content in the single crystal formed with Czochralski method. Eventually, RF-SOI substrates may be made from such single crystal with low oxygen content.

Please note that Czochralski method used here may be one of variants of Czochralski method.

In an example, the superconducting coils may be controlled to generate induced currents to meet one of the requirements in crystal growing process. The current ration of the first and second currents may be 1:n, in which n may be not equal to 1. Please note that n may be, but not limited to, a value which is greater than or less than 1, or an integer greater than 1.

In an example, the asymmetric magnetic field may be constructed by a pair or a plurality pairs of superconducting coils which may have a round shape, i.e., the first superconducting coil may have a round shape and/or the second superconducting coil may have a round shape. Please note that the superconducting coils may have another type of shape, which may not be limited to round shape, but may be an oval shape or a saddle shape, etc. By arranging the shape of the superconducting coils, generation of the asymmetric magnetic flux distribution and the asymmetric convection structure in the melt, caused by the asymmetric inhibition, may be facilitated. Further, the shape of the first and second superconducting coils may be the same or different, and no specific limitation of shapes and sizes are intended here.

In an example, either a singular or plural number of one of the superconducting coils may be configured to form the required asymmetric magnetic flux distribution inside the crucible and asymmetric convection structure in the melt. Therefore, the first superconducting coil may have a singular number or a plural number, and/or the second superconducting coil may have a singular number or a plural number, so as to form the asymmetric magnetic field based on the superconducting coils and the current ratio among them.

In an example, through a designed improvement of a horizontal magnetic element, the current passing through the superconducting coils may be controlled solely, i.e. controlling the first superconducting coil to generate the first current, and controlling the second superconducting coil to generate the second current. For instance, in the controlling mechanism to configure the asymmetric magnetic field, as shown in FIG. 2, stand-alone controlling to carry out the 1:n current ratio may be implemented by controlling the coils with two stand-alone controllers, such as a first controller and a second controller, respectively. The first and second controllers are separated from each other.

Based on the present invention, some embodiments provide an apparatus for crystal growth corresponding to one of the aforesaid methods.

Figure 7:
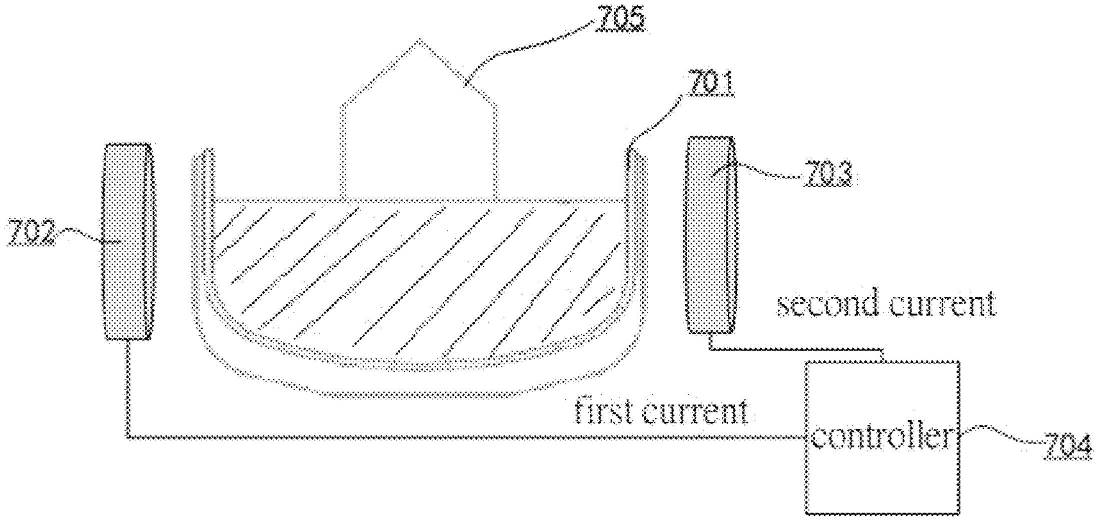
FIG. 7 shows a perspective view of a structure of an apparatus for crystal growth.

As shown in FIG. 7, an apparatus for crystal growth may comprise: a crucible 701; a first superconducting coil 702 and a second superconducting coil 703, distributed outside the crucible 701, opposite to each other, to generate a magnetic field in the crucible 701; a controller 704, controlling the first superconducting coil 702 generating the first current and controlling the second superconducting coil 703 generating the second current, wherein a value of the first current is not equal to a value of the second current, for example, a current ratio of the first and second currents may be 1:n (n may be a value which is not equal to 1); and a pulling-up mechanism 705, pulling up to grow a single crystal in the magnetic field in the crucible 701, which is asymmetric magnetic field, based on the first current and the second current.

Please note that the crucible 701 and the pulling-up mechanism 705 may be corresponding parts of a conventional apparatus here. By controlling the current ratio of the first and second superconducting coils 702, 703 with the controller 704, the current ratio between the first and second superconducting coils 702, 703 generating the magnetic field in the crucible 701 is no longer 1:1, but 1:n which makes the magnetic field asymmetric. As such, an asymmetric convection structure in the melt in the crucible 701 is formed.

In an example, the superconducting coils may be solely controlled. Specifically, the controller may comprise a first controller and a second controller, the first superconducting coil may be controlled by the first controller to generate a first current, and the second superconducting coil may be controlled by the second controller to generate a second current.

In an example, the superconducting coils may have but are not limited to a round shape. Specifically, the first superconducting coil may have a round shape, an oval shape or a saddle shape, and/or the second superconducting coil may have a round shape, an oval shape or a saddle shape.

In an example, the first superconducting coil may have a singular number or a plural number, and/or the second superconducting coil may have a singular number or a plural number. The key is to control two unequal currents passing through the first and second superconducting coils respectively to generate the asymmetric magnetic field.

Based on the present invention, some embodiments provide a substrate with low oxygen content to be used as an RF-SOI substrate.

Specifically, the RF-SOI substrate may be obtained by one of the crystal growing methods of an embodiment according to the present disclosure or grown by Czochralski method with the apparatus according to an embodiment according to the present disclosure.

In the present disclosure, similarities and differences may be referred between embodiments. Only differences may be emphasized in each embodiment. Especially, similarities of the later embodiments, such as the ones for products, may be referred to the former embodiments, such as the ones for systems, because the process flow in the later embodiments corresponding to the products may only be briefly introduced.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims.

What is claimed is:

1. A crystal growing method, comprising:

controlling a first superconducting coil to generate a first current, and controlling a second superconducting coil to generate a second current, wherein a value of the first current is not equal to a value of the second current, and the first superconducting coil and the second superconducting coils are superconducting coils which are distributed outside a crucible, opposite to each other, to generate a magnetic field in the crucible; and based on the first current and the second current, pulling up to grow a single crystal in the magnetic field in the crucible, which is an asymmetric horizontal magnetic field.

2. The crystal growing method according to claim 1, wherein a ratio of the value of the first current to the value of the second current is 1: n, and n is not equal to 1.

3. The crystal growing method according to claim 1, wherein the first superconducting coil has a round shape, an oval shape or a saddle shape, and/or the second superconducting coil has a round shape, an oval shape or a saddle shape.

4. The crystal growing method according to claim 1, wherein the first superconducting coil has a singular number or a plural number, and/or the second superconducting coil has a singular number or a plural number.

5. The crystal growing method according to claim 1, wherein with a first controller, the first superconducting coil is controlled to generate the first current, and with a second controller, the second superconducting coil is controlled to generate the second current.

* * * * *